United States Patent [19]

Truong et al.

[11] Patent Number: 5,397,946

[45] Date of Patent: Mar. 14, 1995

[54] HIGH-VOLTAGE SENSOR FOR INTEGRATED CIRCUITS

[75] Inventors: Phat C. Truong, Houston; Tim M. Coffman, Sugar Land; Sung-Wei Lin, Houston, all of Tex.; T. Damodar Reddy, Nalgonda, India; Dennis R. Robinson, Needville, Tex.

[73] Assignee: Texas Instruments Incorporated, Dallas, Tex.

[21] Appl. No.: 149,246

[22] Filed: Oct. 26, 1993

[51] Int. Cl.⁶ .................. H03F 3/193; G11C 7/00
[52] U.S. Cl. .................. 327/74; 330/288; 365/228; 327/75
[58] Field of Search ............ 307/272.3, 296.6, 296.8, 307/530, 362, 360, 363; 365/228; 330/288

[56] References Cited

U.S. PATENT DOCUMENTS

| | | | |
|---|---|---|---|
| 4,321,489 | 3/1982 | Higuchi et al. | 307/362 |
| 4,471,292 | 9/1984 | Schenck et al. | 330/288 |
| 4,594,518 | 6/1986 | Pollachek | 307/350 |
| 4,658,156 | 4/1987 | Hashimoto | 307/350 |
| 4,659,944 | 4/1987 | Miller, Sr. et al. | 307/350 |
| 4,812,680 | 3/1989 | Kawashima et al. | 307/362 |
| 5,280,198 | 1/1984 | Almulla | 307/272.3 |

Primary Examiner—John S. Heyman
Assistant Examiner—Eunja Shin
Attorney, Agent, or Firm—Theodore D. Lindgren; Leo N. Heiting; Richard L. Donaldson

[57] ABSTRACT

The CMOS high-voltage sensor circuit has a voltage reference including, for example, of four N-channel MOS transistors; one pass-gate P-channel transistor; one current-mirror P-channel MOS transistor; and a conventional high-voltage sensor including, for example, of two P-channel MOS transistors and one N-channel MOS transistor. The sensor circuit of this invention generates a high-voltage signal at the output if the input voltage is greater than both the reference voltage plus two P-channel threshold voltages and the supply voltage Vcc plus two P-channel threshold voltages. The power-up or power-down sequence may be in any order without adversely affecting the operation of the circuit of this invention.

20 Claims, 2 Drawing Sheets

HIGH-VOLTAGE SENSOR FOR INTEGRATED CIRCUITS

BACKGROUND OF THE INVENTION

The present invention relates to integrated-circuits and, in particular, to a circuit and a method for sensing a high voltage signal at a connection pin or signal pin of an integrated circuit.

Many integrated circuits require high-voltage sensor circuitry to detect the voltage levels at one or more connection pins. A supply-level voltage at a particular connection pin of a nonvolatile memory device may indicate, for example, that a read operation is to be performed. However, a voltage higher than supply-level at that same pin may indicate that another operation is to be performed. For example, on a flash EPROM device, a supply-level voltage applied to the programming-voltage pin indicates that reading operation is to be performed whereas a voltage of 12 V applied to the programming-voltage pin indicates that either a programming or an erasing operation is to be performed. In flash EPROMs, high voltage levels applied to various pins during manufacture are used, for example, to reconfigure the device, to replace defective columns with redundant columns, to disable sections, and to perform bitline short tests. Briefly, high-voltage sensor circuitry detects the high-level voltage input at a connection or signal pin and, in response, provides an output signal to other circuitry in the device to cause the device to enter a special operational mode (e.g., program, erase or test mode) other than the normal mode (e.g., read mode). If the high-voltage sensor circuitry does not function properly, a device such as a nonvolatile memory may be erroneously programmed, erased or stressed.

Normally, the output of high-voltage sensor circuitry provides a low-voltage (Vss or ground). However, if the input voltage to the circuitry is above a certain voltage level, the output switches to a high-voltage (Vcc, the power supply voltage). The switch to the high-voltage output occurs if the input voltage is above a specified reference-voltage level, usually the supply voltage Vcc plus a specified margin.

During the sequence of coupling the power supply voltage Vcc to the integrated circuit (power-up), or of de-coupling the power supply voltage from the integrated circuit (power-down), many prior-an high-voltage sensor circuits furnish an output signal erroneously indicating that a high-voltage level has been applied to device. That is because prior-art high-voltage sensor circuits are designed to detect high-input-voltage levels only during normal operation. Therefore, those prior-art circuits require that the power-up sequence be followed exactly to ensure that the high-voltage sensor circuit does not erroneously furnish an output signal indicating detection of a high-voltage level.

A typical prior-an high-voltage sensor circuit detects a high voltage at a level that is approximately equal to the supply voltage Vcc plus two P-channel threshold voltages. This two P-channel-threshold-voltage margin ascertains that the circuit does not consume any power when the input voltage to the circuit is less than the supply voltage Vcc plus the two-P-channel threshold-voltage margin. However, the output of the prior-art high-voltage sensor can erroneously furnish a high voltage signal, particularly during the power-up or power-down sequence. Assume, for example, that the prior-art high-voltage sensor circuit is designed to trigger at the nominal value of Vcc (5 V) plus two P-channel threshold voltages, each equal to about 1 V. However, if supply voltage Vcc is actually 3 V instead of the nominal 5 V (3 V is within tolerance for many integrated-circuit applications) any voltage greater that 5 V applied to that particular pin will cause the high-voltage sensor circuit to erroneously switch to an output indicating that a high voltage has been applied to the pin. And because the supply voltage is always 3 V for a moment of time during each of the power-up and power-down sequences, the device may be caused to enter an undesired operational mode during those sequences.

SUMMARY OF THE INVENTION

The high-voltage sensor circuitry of this invention generates a high-voltage signal at the output if the input voltage is greater than both (1) a reference voltage plus two P-channel threshold voltages and (2) the supply voltage Vcc plus two P-channel threshold voltages. The reference voltage may be a value specified for a particular application of the circuit. For example, the value of the reference voltage may be determined by use of four N-channel threshold voltages.

The CMOS high-voltage sensor circuit of this invention comprises a voltage reference circuit including, for example, four N-channel MOS transistors; a one pass-gate P-channel transistor; a current mirror P-channel MOS transistor; and a conventional high-voltage sensor including, for example, of two P-channel MOS transistors and one N-channel MOS transistor.

An advantage of the circuit of this invention is that the device does not constrain the power-up or power-down sequence.

DETAILED DESCRIPTION OF THE INVENTION

The high-voltage sensor circuitry of this invention is used, for example, in flash EPROM memories for proper detection of high-voltage signals applied to the connection or signal pins of such devices. However, the circuitry of this invention is suitable for use in any electronic system/circuit implemented with CMOS devices.

Figure 1:
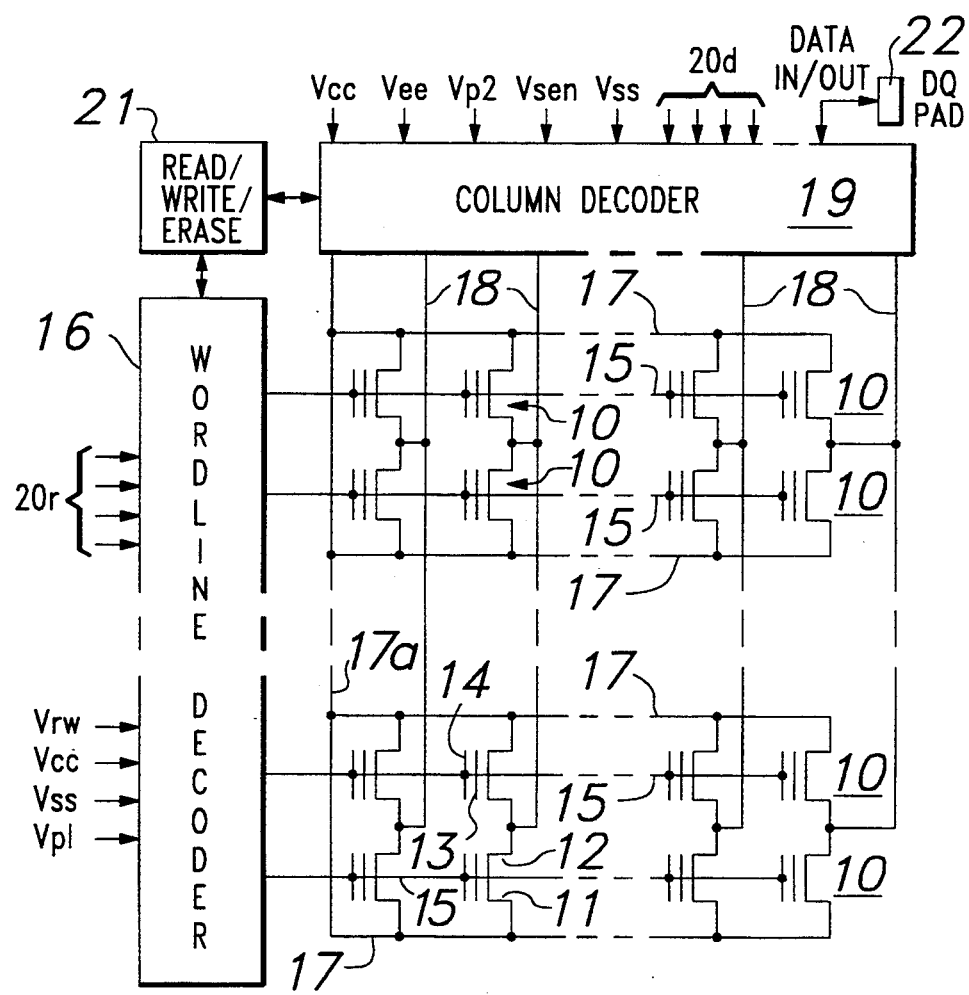
FIG. 1 is an electrical schematic diagram, in partial block form, of an EEPROM memory array.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from Read/Write/Erase control circuit 21 (which may include circuitry of an external microprocessor not shown), to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

In a write (program) mode the wordline decoder 16 may function, in response to wordline address signals on lines 20r and to signals from Read/Write/Erase control circuit 21, to place a preselected first programming voltage Vp1 (approx. +12 V) on a selected wordline 15, including a selected control-gate 14. Column decoder 19 also functions to place a second programming voltage Vp2 (approx. +5 to +10 V) on a selected drain-column line 18 and, therefore, the drain 12 of selected cell 10. Source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with Vp1 at 0 V). For memory cells 10 fabricated in accordance with the example embodiment, the coupling coefficient between a control gate 14/wordline 15 and a floating gate 13 is approximately 0.6. Therefore, a prior-an programming voltage Vp1 of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 v,) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash-erase mode, the column decoder 19 functions to leave all drain-column lines 18 floating (connected to a high impedance such as field-effect transistor biased in "OFF" condition). The wordline decoder 16 functions to connect all the wordlines 15 to reference potential Vss, which may be ground. The column decoder 19 also functions to apply a high positive voltage Vee (approx. +9 V to +15 V) to all the source lines 17. These erasing voltages create sufficient field strength across the gate oxide region to generate a Fowler-Nordheim tunnel current that transfers charge from the floating gate 13, erasing the memory cell 10.

For convenience, a table of read, write and erase voltages, is given in TABLE I below:

TABLE I

|  | Read | Write | Flash Erase |
| --- | --- | --- | --- |
| Selected Wordline | 5 V | 12 V | 0 V (All) |
| Deselected Wordlines | 0 V | 0 V | — |
| Selected Drain Line | 1.0 V | 5–10 V | Float (All) |
| Deselected Drain Lines | 0 V/Float | 0 V/Float | — |
| Source Lines | 0 V | 0 V | 9–15 V (All) |

Figure 2:
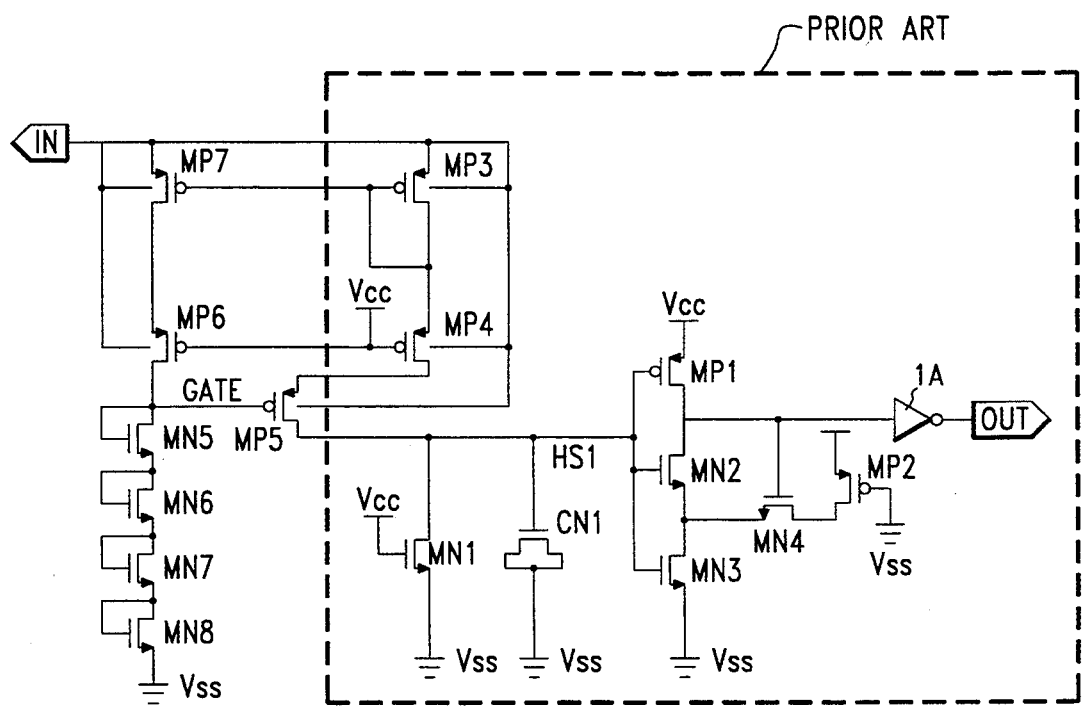
FIG. 2 is a schematic diagram of the high-voltage sensor circuitry of this invention, including prior-art circuitry as indicated.

A high-voltage sensor circuit for use with the device of FIG. 1 is shown in FIG. 2. The terminal IN of the circuit of FIG. 2 may be any of the connection or signal pins Vee, Vp1, Vp2, 20r, 20d, etc. of FIG. 1 and the circuitry may, for example, be included in Read/Write/Erase control circuit 21.

In the circuit of FIG. 2 transistors MN1, MP3 and MP4 form a conventional, or prior-art, high-voltage sensor that generates a high voltage signal (Vcc) at the output terminal OUT if the voltage level of the terminal IN is more than Vcc plus two P-channel threshold voltages. Transistors MN5, MN6, MN7, MN8, MP5, MP6 and MP7 are added to the conventional high-voltage sensor to form a new operating condition, the new condition generating a high-voltage signal (Vcc) at the output terminal OUT if the voltage level of the terminal IN is more than four N-channel threshold voltages plus two P-channel threshold voltages. The current supplied for this portion of circuit comes from the voltage supply at the terminal IN, which is mirrored from transistor MP3 to transistor MP7 to generate a voltage equal to four N-channel threshold voltages at the node GATE. The combination of these two portions allows the circuit to generate a high voltage (Vcc) at the output terminal OUT only if the voltage level of the terminal IN is higher than both Vcc plus two P-channel threshold voltages and four N-channel threshold voltages plus two P-channel threshold voltages. Transistors MP1, MN2, MN3, MN4 and MP2 and inverter I1 form a Schmidt trigger, which prevents the voltage level of output terminal OUT from becoming unstable when the voltage of node HS10 has very slow ramp rate.

The use of transistors MN5, MN6, MN7, MN8, MP5, MP6 and MP7 permits the circuitry to generate a high voltage level at the output only if the voltage level of the terminal IN is more than four N-channel threshold voltages plus two P-channel threshold voltages. Therefore, a low power supply voltage Vcc does not adversely affect the output of this circuitry.

Specifically, the circuit of FIG. 2 furnishes a high voltage level (Vcc) at the output terminal OUT if the voltage level of the terminal IN is greater than the maximum of (1) a reference voltage plus two P-channel threshold voltages and (2) the supply voltage Vcc plus two P-channel threshold voltages. The reference voltage may be a value specified for a particular application of the circuit. For example, the circuit in FIG. 2 illustrates the use of four N-channel threshold voltages (the threshold voltages of N-channel diodes MN5–9) to determine the value of the reference voltage. The reference voltage may, of course, be changed by changing the number of diodes MN5–9 connected in series.

P-channel transistors MP6 and MP4 prevent the circuit of FIG. 2 from consuming power if the voltage level of the terminal IN is less than supply voltage Vcc plus two P-channel threshold voltages. When the voltage level of the terminal IN rises above the value of the supply voltage Vcc plus two P-channel threshold voltages, transistor MP4 starts conducting current. However, N-channel transistor MN1 maintains the voltage level of node HS10 at ground level Vss. Mirror current from P-channel transistor MP3 to P-channel transistor MP7 raises the voltage level of node GATE, causing the current in P-channel transistor MP5 to cutoff. This allows long-channel, N-channel transistor MN1 to maintain the voltage level of node HS10 at ground level Vss as the voltage level of node IN increases. Until the voltage level of node IN rises above four N-channel threshold voltages plus two P-channel threshold voltages, the voltage level of node GATE is stable at a value equal to four N-channel threshold voltages, and the current in transistor MP5 starts increasing when the voltage level of node IN goes higher than that value. When the current in transistor MP5 increases, it overcomes device MN1, causing an increase in the voltage level of node HS10, and causing the voltage level of the output terminal OUT to be high (Vcc). As discussed above, a Schmidt trigger stage after node HS10 eliminates any oscillation when the voltage level of terminal IN is ramped very slowly.

Node GATE may not have a quick response when the signal transition at terminal IN increases rapidly from low to high. Capacitor CN1 ensures that node HS10 remains at ground level Vss until the voltage at node GATE stable. Capacitor CN1 forms a filter/delay mechanism to slow the response of the circuit.

Long-channel transistor MN1 can be replaced by a very high-impedance resistor to ensure that node HS10 remains at ground level if the supply voltage Vcc is less than one N-channel threshold voltage. Since most of the CMOS circuitry does not operate when the voltage level of supply terminal Vcc is less than one N-channel threshold voltage, the N-channel transistor MN1 is used in this example.

The method described herein for providing high-voltage sensing at a signal pin of an integrated circuit comprises the steps of (1) sensing to determine whether or not the voltage at the signal pin is greater than a reference voltage plus a first number of transistor threshold voltages, (2) at the same time, sensing to determine whether or not the voltage at the signal pin is greater than the supply voltage plus a second number of transistor threshold voltages, and (3) if the voltage at the signal pin is greater than both the reference voltage plus the first number of transistor threshold voltages and the supply voltage plus the second number of transistor threshold voltages, generating an output signal.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A high-voltage sensor circuit for an integrated circuit, said integrated circuit including a connection pin, a supply-voltage pin and a reference-voltage pin, said sensor circuit comprising:
   a first transistor with a first source-drain a second source-drain and a gate, said first source-drain of said first transistor coupled to said connection pin;
   a second transistor with a first source-drain a second source-drain and a gate, said first source-drain of said second transistor coupled to said second source-drain of said first transistor, said gate of said second transistor coupled to said supply-voltage pin;
   a third transistor with a first source-drain a second source drain and a gate, said first source drain of said third transistor coupled to said connection pin, said gate of said third transistor coupled to said gate of said first transistor;
   a fourth transistor with a first source drain a second source-drain and a gate, said first source-drain of said fourth transistor coupled to said second source-drain of said third transistor, said gate of said fourth transistor coupled to said gate of said second transistor;
   a fifth transistor with a first source drain a second source-drain and a gate, said first source-drain of said fifth transistor coupled to said second source-drain of said fourth transistor; said second source-drain of said fifth transistor coupled to an output, said gate of said fifth transistor coupled to said second source-drain of said second transistor; and
   a voltage reference circuit coupled between said gate of said fifth transistor and said reference-voltage pin.

2. The circuit of claim 1, wherein each of said first, second, third, fourth and fifth transistors is a P-channel transistor.

3. The circuit of claim 1, wherein said voltage reference circuit includes four diode-connected transistors connected in series between said gate of said fifth transistor and said reference-voltage pin.

4. The circuit of claim 3, wherein said diode-connected transistors are N-channel transistors.

5. The circuit of claim 1, wherein said second source-drain of said fifth transistor is coupled to said output through a Schmidt trigger circuit.

6. The circuit of claim 1, wherein said second source-drain of said fifth transistor is coupled to said reference voltage pin by a capacitor.

7. The circuit of claim 1, wherein said second source-drain of said fifth transistor is coupled to said reference-voltage pin by a resistor.

8. The circuit of claim 1 further including a sixth transistor, a gate of said sixth transistor coupled to said supply-voltage pin, a source-drain path of said sixth transistor coupled between said reference-voltage pin and said second source-drain of said fifth transistor.

9. The circuit of claim 1 further including a sixth transistor, a gate of said sixth transistor coupled to said supply-voltage pin, a source-drain path of said sixth transistor coupled between said reference-voltage pin and said second source-drain of said fifth transistor, the source-drain path of said sixth transistor being longer than the source-drain path of said fifth transistor.

10. A method for providing high-voltage sensing at a signal pin of an integrated circuit, the method comprising the steps of:

sensing to determine whether or not the voltage at said signal pin is greater than a reference voltage plus a first number of transistor threshold voltages;

at the same time, sensing to determine whether or not said voltage at said signal pin is greater than the supply voltage plus a second number of transistor threshold voltages; and if said voltage at said signal pin is greater than both said reference voltage plus said first number of transistor threshold voltages and said supply voltage plus said second number of transistor threshold voltages, generating an output signal.

11. The method of claim 10, wherein said reference voltage is the sum of a third number of transistor threshold voltages.

12. The method of claim 10, wherein said reference voltage is the sum of four transistor N-channel transistor threshold voltages.

13. The method of claim 10, wherein said transistor threshold voltages are P-channel transistor threshold voltages.

14. The method of claim 10, wherein said first number of transistor threshold voltages is two P-channel threshold voltages.

15. The method of claim 10, wherein said second number of transistor threshold voltages is two P-channel threshold voltages.

16. The method of claim 10, wherein said output signal is a high voltage.

17. The method of claim 10, wherein said signal pin is connected to a circuit, said circuit further including a Vcc pin and a Vss pin, said circuit comprising:

a first transistor with a first source-drain a second source-drain and a gate, said first source-drain of said first transistor coupled to said signal pin;

a second transistor with a first source-drain a second source-drain and a gate, said first source-drain of said second transistor coupled to said second source-drain of said first transistor, said gate of said second transistor coupled to said Vcc pin;

a third transistor with a first source-drain a second source-drain and a gate, said first source-drain of said third transistor coupled to said signal pin, said gate of said third transistor coupled to said gate of said first transistor;

a fourth transistor with a first source-drain a second source-drain and a gate, said first source-drain of said fourth transistor coupled to said second source-drain of said third transistor, said gate of said fourth transistor coupled to said gate of said second transistor;

a fifth transistor with a first source-drain a second source-drain and a gate, said first source-drain of said fifth transistor coupled to said second source-drain of said fourth transistor; said second source-drain of said fifth transistor coupled to said output, said gate of said fifth transistor coupled to said second source-drain of said second transistor; and a voltage reference circuit coupled between said gate of said fifth transistor and said Vss pin.

18. The method of claim 17, wherein each of said first, second, third, fourth and fifth transistors is a P-channel transistor.

19. The method of claim 17, wherein said voltage reference circuit includes four diode-connected transistors connected in series between said gate of said fifth transistor and said Vss pin.

20. The method of claim 17, wherein said voltage reference circuit includes four N-channel diode-connected transistors connected in series between said gate of said fifth transistor and said Vss pin.

* * * * *